(12) United States Patent
Satoh

(10) Patent No.: US 7,535,221 B2
(45) Date of Patent: May 19, 2009

(54) MAGNETIC SENSOR ELEMENT AND ELECTRONIC DIRECTIONAL MEASURING DEVICE

(75) Inventor: Masahiro Satoh, Nishitokyo (JP)

(73) Assignee: Citizen Holdings Co., Ltd., Tokyo (JP)

( * ) Notice: Subject to any disclaimer, the term of this patent is extended or adjusted under 35 U.S.C. 154(b) by 278 days.

(21) Appl. No.: 11/724,222

(22) Filed: Mar. 15, 2007

(65) Prior Publication Data

US 2007/0222441 A1 Sep. 27, 2007

(30) Foreign Application Priority Data

Mar. 17, 2006 (JP) ............................. 2006-074572

(51) Int. Cl.
*G01R 33/04* (2006.01)
(52) U.S. Cl. ..................................... 324/253
(58) Field of Classification Search ......... 324/244–253, 324/258, 260
See application file for complete search history.

(56) References Cited

U.S. PATENT DOCUMENTS

| 4,967,156 A | * | 10/1990 | Seitz ........................... 324/249 |
| 5,793,208 A | * | 8/1998 | Ito .............................. 324/253 |
| 6,194,897 B1 | * | 2/2001 | Fukunaga .................... 324/255 |
| 6,411,086 B1 | * | 6/2002 | Choi et al. ................... 324/253 |
| 6,650,112 B2 | * | 11/2003 | Takayama et al. ............ 324/249 |
| 6,753,682 B2 | * | 6/2004 | Kang et al. .................. 324/253 |
| 6,759,845 B2 | * | 7/2004 | Kang et al. .................. 324/253 |
| 7,015,691 B2 | * | 3/2006 | Kang et al. .................. 324/253 |

FOREIGN PATENT DOCUMENTS

JP 2004-184098 * 7/2004

* cited by examiner

*Primary Examiner*—Jay M Patidar
(74) *Attorney, Agent, or Firm*—Westerman, Hattori, Daniels & Adrian, LLP.

(57) ABSTRACT

A magnetic sensor element of a flux gate type comprising a magnetism sensitive part (8a) formed by winding a coil (3) around a magnetic core layer (8), and magnetism collective part (8b) for guiding magnetic fluxes to the magnetism sensitive part (8a). Respective central parts of the magnetism collective part (8b) are connected with the respective ends of the magnetism sensitive part (8a). Therefor the magnetic core layer (8) is formed so as to resemble a letter H in planar shape. And the coil (3) of the magnetism collective part (8b) is a thin-film coil comprising a plurality of upper coil thin-films (12) and a plurality of lower coil thin-films (4) formed on an upper surface and a lower surface of the magnetic core layer (8) via insulation layers by connecting together the respective lower coil thin-films (4) and the upper coil thin-films (12), at respective adjacent ends thereof, so as to be sequentially continuous with each other.

19 Claims, 11 Drawing Sheets

MAGNETIC SENSOR ELEMENT AND ELECTRONIC DIRECTIONAL MEASURING DEVICE

BACKGROUND OF THE INVENTION

1. Field of the Invention

The present invention relates to a magnetic sensor element of a parallel flux gate type, small in size, and an electronic directional measuring device with the magnetic sensor elements mounted therein, and more particularly, to a magnetic sensor element of the flux gate type, small in size, and mountable in a portable terminal, and an electronic directional measuring device provided with three units of the magnetic sensor elements, arranged so as to be orthogonal in orientation to each other.

2. Description of the Related Art

An electronic directional measuring device has a feature in that a bearing can be electrically detected with the use of a magnetic sensor, and so forth. The electronic directional measuring device is generally made up by disposing a plurality of the magnetic sensor elements thereon. The magnetic sensor elements of the parallel flux gate type, like this, exhibit a linear output against a magnetic field parallel to an excited magnetic field. Accordingly, by performing computation on data obtained from respective outputs of the plurality of the magnetic sensor elements arranged so as to be orthogonal in orientation to each other, it is possible to calculate an angle from a direction decided as a reference, that is an azimuth. Because information on a bearing obtained from the azimuth can be processed in the form of an analog electric signal or a digital electric signal, hopes run high that the electronic directional measuring device will be applied to various electronic equipment, for example, a cellular phone, portable terminal such as PDA (Personal Digital Assistant), wristwatch, car-navigation device, a device for detection of an posture of an aircraft, a game player for use by the visually handicapped, and so forth.

Particularly, a service for providing position information, utilizing GPS (Global Positioning System), and so forth, intended for use by the portable terminal, has lately become available. With the service, a user can find out the present position information while watching a screen on the terminal. With the use of the terminal if combined with the electronic directional measuring device, the user can find out in which bearing he or she is oriented, or for which direction he or she is heading when walking. It is believed that an information service concerning the position information and the electronic directional measuring device will provide many sectors of the industry with an opportunity of new business in the future, offering useful information to the user as well.

Meanwhile, there has been seen a tendency of the portable terminal being rendered smaller in size as well as thickness, and an electronic device mounted therein is required to be small in size, and low in height. The magnetic sensor element as desired at present has a width on the order of several mm while a height thereof, 1.5 mm or less, is essential, and the height preferably 1.0 mm or less is in demand.

In order to solve such a problem as above-described, there has been proposed a magnetic sensor element of the parallel flux gate type, in a strip-like shape, that can be reduced in size (for example, refer to Patent Document 1).

Patent Document 1: JP 2004-184098 A (p. 6, FIG. 1)

Accordingly, an example of a conventional magnetic sensor element, disclosed in Patent Document 1, is described hereinafter with reference to FIGS. 24 to 26. FIG. 24 is a perspective view showing a makeup of the magnetic sensor element, FIG. 25 is a plan view showing a size of the magnetic sensor element, and FIG. 26 is a side view of the magnetic sensor element.

The magnetic sensor element 100 makes use of a permalloy film as a magnetic core layer 110, and is made up such that a coil 130 is wound round a middle part of a nonmagnetic base 120 with the magnetic core layer 110 stuck thereto, in the longitudinal direction thereof. Further, the magnetic sensor element comprises a middle part of the magnetic core layer 110, around which the coil 130 is wound, serving as a magnetism sensitive part 111, respective ends of the magnetic core layer 110, serving as magnetism collective part 112, and electrode pads 140 provided at respective ends of the nonmagnetic base 120. And by rendering the magnetism sensitive part 111 at the central part of the magnetic core layer 110, in the longitudinal direction thereof, smaller in cross-sectional area than the magnetism collective part 112 at respective ends of the magnetic core layer 110, magnetic fluxes are concentrated, thereby increasing a deviation amount on a B-H curve. If the magnetic sensor element is made up as above-described, dimensions thereof can be rendered on the order of 3 mm in length in the longitudinal direction thereof and 0.3 mm in width, as shown in FIG. 25, even if such properties described as above are imparted. The magnetism sensitive part 111 is formed to have a width on the order of 0.05 mm.

With a biaxial magnetic sensor (an electronic directional measuring device), wherein two units of the magnetic sensor elements are arranged in respective direction orthogonal to each other on the horizontal surface of a base, a height can be held to the order of 1 mm although a slight increase in width. Accordingly, it becomes possible to mount the electronic directional measuring device having the biaxial magnetic sensor in the portable terminal.

When the magnetic sensor element made up as described is rotated once in the same plane, the magnetic sensor element exhibits an output in a sinusoidal waveform. Two outputs of the biaxial magnetic sensor provided with two magnetic sensor elements disposed so as to cross each other at 90 degrees will be in a relationship whereby respective output waveforms are shifted in the phase each other by 90 degrees, and on the basis of the respective output, it is possible to calculate an azimuth. The magnetic sensor element of the parallel flux gate type capable of obtaining an output proportional to a magnetic field is based on following principle of detection.

First, a triangular wave current is applied to an excitation coil wound around the magnetic core layer. By the agency of a triangular wave magnetic field produced by the triangular wave current, the magnetic core layer repeats magnetization saturation and magnetization reversal along a B-H curve. As a pulse-like output is generated at the time of the magnetization reversal, the pulse-like output is detected by a detection coil. A pulse position will shift according to magnitude of an external magnetic field, if no change occurs to frequency of the triangular wave current. By taking out a change in time for pulse generation via a detection circuit, it is possible to obtain the output corresponding to the magnitude of the external magnetic field. In explanation given as above, the coils are described as separated between the excitation coil and the detection coil however, one coil can be used as both an excitation coil and a detection coil.

However, when a user attempts to obtain a direction with using a portable terminal provided with the electronic directional measuring device, which is the biaxial magnetic sensor having the function described as above, the portable terminal being in a tilted state (under a tilted environment), the following problem will occur to the electronic directional measuring device.

More specifically, it is presumed that the user of a portable terminal will adopt various use, and various manners of holding the portable terminal, and there can be the case where the magnetic sensor elements incorporated in the electronic directional measuring device are used in a tilted state against to a horizontal surface. Under such an environment as described, the biaxial magnetic sensor as described is incapable of calculating an accurate azimuth. For coping with the problem, three units of the magnetic sensor elements are prepared, and are disposed so as to be oriented along three axes orthogonal to each other, this will enable an azimuth to be accurately found even if the portable terminal is used in a tilted state against to a horizontal surface.

FIG. 27 shows an configuration example of an electronic directional measuring device made up by a triaxial magnetic sensor employing the magnetic sensor elements described in Patent Document 1 as previously described.

The conventional electronic directional measuring device as shown in FIG. 27, comprises an x-axis magnetic sensor element 100$x$, a y-axis magnetic sensor element 100$y$, and a z-axis magnetic sensor element 100$z$, disposed on the surface of the epoxy base 200, in such a way so as to be orthogonal to each other in the respective directions of the x, y, z axes. Further, the electronic directional measuring device comprises a magnetic sensor IC 300 for driving those magnetic sensor elements, and processing detection signals outputted from those magnetic sensor elements, respectively.

With a configuration described as above, there arises the need for disposing the z-axis magnetic sensor element 100$z$ such that the longitudinal direction thereof is perpendicular to the x-axis magnetic sensor element 100$x$ and the y-axis magnetic sensor element 100$y$, disposed along the horizontal two axes. Accordingly, a height of the electronic directional measuring device will become at least 3 mm or more (refer to FIG. 25). It is not possible to achieve a reduction in the height by mounting the electronic directional measuring device having the configuration described as above in the portable terminal, therefore that is not preferable.

Under the circumstances, in order to achieve further miniaturization of the conventional magnetic sensor element there occurs an idea of shortening the length of the element in the longitudinal direction. However, if the element is simply reduced in size, this will render it difficult to make effective magnetic fluxes to be converged. That is, with the magnetic sensor element in such a form, the effect of a demagnetizing field, due to a geometric effect, will become remarkable, so that magnetic fluxes collected at the respective magnetism collective part 112 shown FIG. 24 will no longer be effectively converged onto the magnetism sensitive part 111.

Further, if widths of the respective ends of the magnetic core layer 110 (widths of the respective magnetism collective part 112) are rendered larger in comparison with a width of the central part thereof (a width of the magnetism sensitive part 111) in order to make external magnetic fluxes to be effectively collected by the magnetic sensor element 100 shown in FIG. 24, this will cause a width of the nonmagnetic base 120 as well to be rendered accordingly larger. Then, an excitation current necessary for causing the magnetism sensitive part 111 to undergo magnetization saturation will become considerably large in magnitude, thereby rendering it practically difficult to cause occurrence of the magnetization saturation.

Further, as another means for reducing the size of the magnetic sensor element in the longitudinal direction, there occurs another idea of keeping the coil in intimate contact with the magnetic core layer and winding the coil around thereof, thereby reducing the central part of the nonmagnetic base 120 as well as the magnetic core layer 110 into a constricted shape. However, it is extremely difficult to reduce the nonmagnetic base 120 into the constricted shape or the like by applying micromachining thereto. Even if the nonmagnetic base 120 can be formed in the constricted shape, the coil will become prone to be very easily broken when the coil is wound around because the width of the central part (the width of the magnetism sensitive part 111) has to be rendered 0.1 mm or less.

Accordingly, with the conventional magnetic sensor element as shown in FIGS. 24 to 27, it is appropriate to render the width of the element on the order of 0.3 mm, and if the width of the element is rendered smaller than that, this will render it difficult to detect geomagnetism, which is not preferable in making up an electronic directional measuring device.

SUMMARY OF THE INVENTION

In view of the problems described as above, it is therefore an object of the invention to provide a magnetic sensor element capable of detecting geomagnetism even if reduced in size, and an electronic directional measuring device that can be reduced in height as well as size, and is mountable in a portable terminal even if the same is a triaxial magnetic sensor made up by disposing three units of the magnetic sensor elements in such a way as to be orthogonal in the direction to each other.

To that end, the invention provides magnetic sensor elements arranged as follows and an electronic directional measuring device using the same.

In accordance with the invention, a magnetic sensor element of a flux gate type comprising a magnetism sensitive part formed by winding a coil around a magnetic core layer, and magnetism collective part connected to respective ends of the magnetism sensitive part for guiding magnetic fluxes to the magnetism sensitive part, wherein the magnetism collective part are a pair of magnetism collective part each in the shape of a long strip, formed integrally with the magnetic core layer of the magnetism sensitive part, extending in the direction orthogonal to the longitudinal direction of the magnetism sensitive part, respective central parts of the magnetism collective part, in the longitudinal direction thereof, are individually connected with the respective ends of the magnetism sensitive part, and the magnetic core layer is formed so as to resemble the letter H in planar shape.

And, the coil is a thin-film coil comprising a plurality of upper coil thin-films provided on a surface of an upper insulation layer formed on one of principal surfaces of the magnetic core layer, opposite from the magnetic core layer, and a plurality of lower coil thin-films provided on a surface of a lower insulation layer formed on the other of the principal surfaces of the magnetic core layer, opposite from the magnetic core layer, formed by connecting together the respective lower coil thin-films and the adjacent upper coil thin-films, at respective ends thereof, so as to be sequentially continuous with each other.

Otherwise, a magnetism collective part of the magnetic core layer may be formed in a shape resembling a closed-loop surrounding the magnetism sensitive part, and two portions of the magnetism collective part joined together, opposed to each other with an enclosed space surrounded by the magnetism collective part interposed therebetween, are connected to both ends of the magnetism sensitive part, in such a way as to substantially halve the enclosed space by the magnetism sensitive part.

The magnetism collective part may be formed in the planar shape of a square frame or a rectangular frame. In such cases, respective corners of the square frame or the rectangular frame are preferably formed in an arc-like shape.

Further, the magnetism collective part may be formed in the planar shape of a circular frame, an elliptical frame, or an oval frame.

Furthermore, the magnetic core layer of the magnetism sensitive part may be divided into a plurality of slender portions thereof, and the coil may be wound around the plurality of the slender portions of the magnetic core layer altogether.

The magnetic core layer formed in the planar shape resemble a letter H is preferably uniform in thickness, and is preferably formed in a whole shape such that a value of B/A falls in a range of 0.8 to 1.5 on the assumption that a length of the magnetic sensitive part along the longitudinal direction, is A, and a length of the magnetism collective part along the direction orthogonal to the longitudinal direction of the magnetism sensitive part, is B.

Further, the magnetic core layer is more preferably formed in the whole shape such that a value of C/B falls in a range of 0.033 to 0.200 on the assumption that a length (width) of the magnetism sensitive part along the direction orthogonal to the longitudinal direction thereof, is C.

Still further, respective edges of the upper insulation layer in the transversely direction of the magnetism sensitive part, preferably have a face inclined at a predetermined angle.

The magnetic core layer can be made up of a permalloy film composed mainly of iron and nickel, or a soft magnetic film composed mainly of iron, nickel, and cobalt, formed by sputtering or plating.

Further, the coil may comprise two thin-film coils, including an excitation coil and a detection coil, formed by connecting together the respective lower coil thin-films and the adjacent upper coil thin-films at respective ends thereof, so as to be alternately and sequentially continuous with each other.

The present invention provides an electronic directional measuring device made up by arranging at least two units of any of the magnetic sensor elements described in the foregoing on a nonmagnetic base.

As the electronic directional measuring device, a triaxial magnetic sensor can be made up by arranging three units of the magnetic sensor elements on the nonmagnetic base and by disposing the respective magnetic sensor elements such that the longitudinal directions of the magnetism sensitive parts thereof cross each other at right angles.

The magnetic sensor element according to the present invention, even if reduced in size, is capable of detecting geomagnetism, and the electronic directional measuring device according to the present invention can be reduced in height as well as size, and is mountable in a portable terminal even if the same is made up as a triaxial magnetic sensor by disposing the three units of the magnetic sensor elements.

The above and other objects, features and advantages of the invention will be apparent from the following detailed description which is to be read in conjunction with the accompanying drawings.

DETAILED DESCRIPTION OF THE PREFERRED EMBODIMENTS

A Basic Embodiment of a Magnetic Sensor Element

A magnetic sensor element according to the present invention basically comprises a magnetic core layer made of a soft magnetic material, and a thin-film coil made up of a lower coil layer and an upper coil layer, and the magnetic core layer adopts a structure made up of a magnetism sensitive part positioned at a central part thereof and magnetism collective part positioned at respective ends thereof. A more specific makeup of the embodiment will be described in detail hereinafter with reference to the accompanying drawings.

Figure 1:
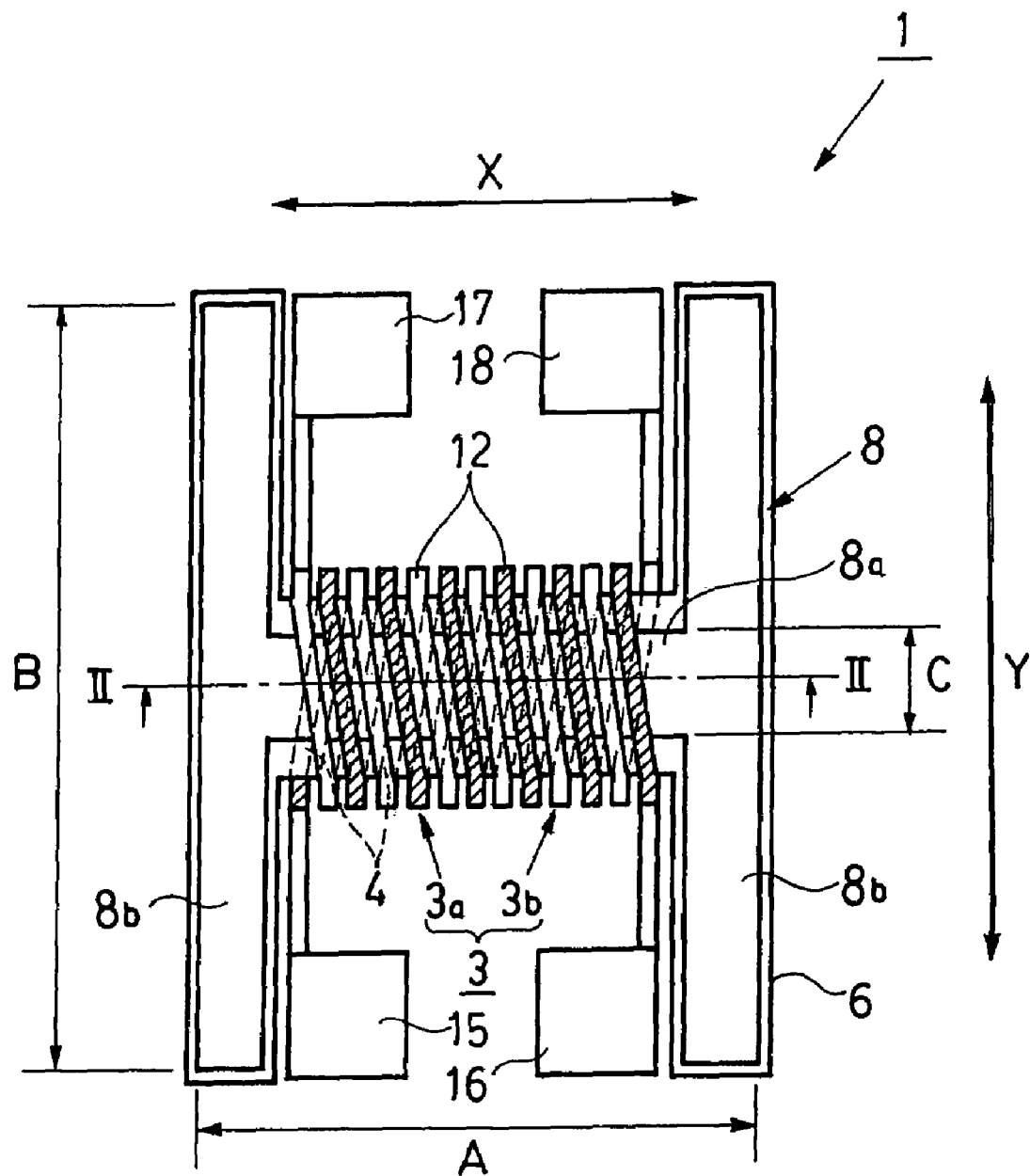
FIG. 1 is a plan view showing a makeup of a basic embodiment of a magnetic sensor element according to the present invention.
Figure 2:
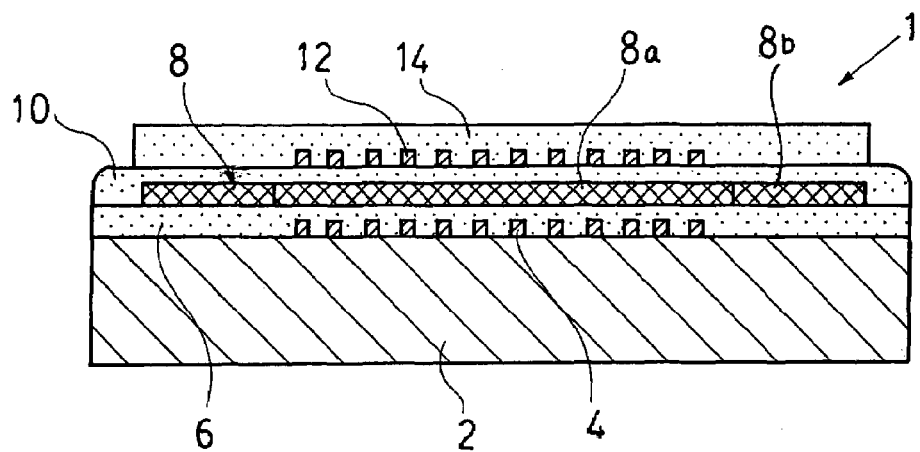
FIG. 2 is an expanded sectional view of the magnetic sensor element along the line II-II in FIG 1.
Figure 3:
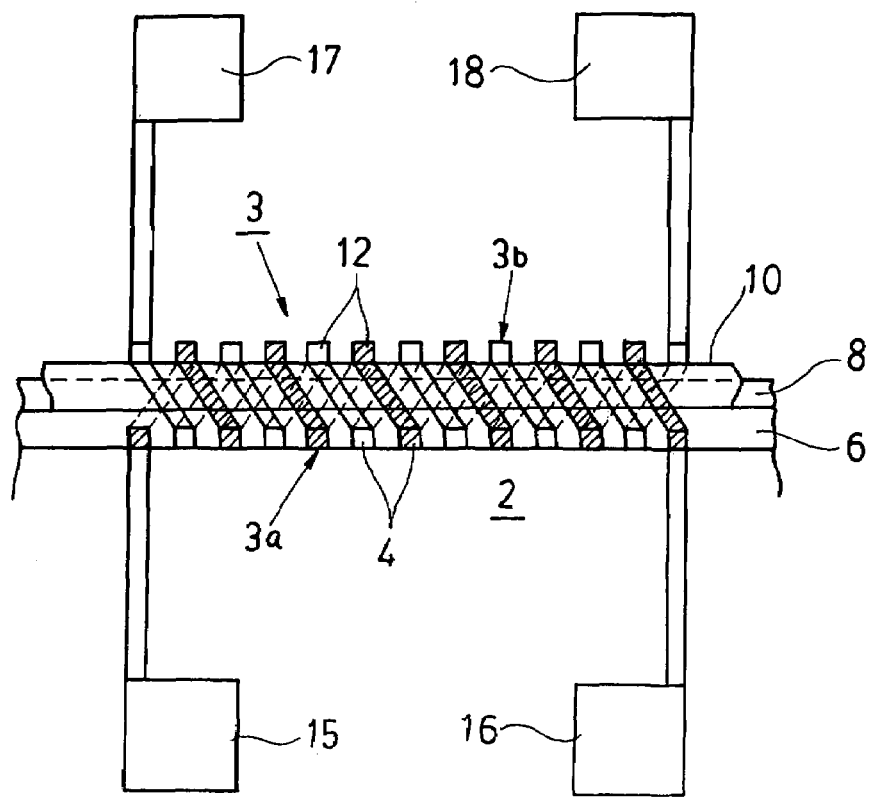
FIG. 3 is an expanded view for describing a state of connection between lower coil thin-films layer and upper coil thin-films shown in FIG. 2.

First, the makeup of the magnetic sensor element according to the basic embodiment of the present invention is described hereinafter. FIG. 1 is a plan view showing the concept of the magnetic sensor element. FIG. 2 is an expanded sectional view of the magnetic sensor element along the line II-II in FIG. 1. Further, the plan view of FIG. 1 shows the magnetic sensor element in a state where a protection film 14 shown in FIG. 2 is excluded. FIG. 3 is an expanded view for describing a state of connection between lower coil thin-films layer and upper coil thin-films shown in FIG. 2.

As shown in FIG. 1, a magnetic sensor element 1 is a magnetic sensor element of a flux gate type comprising a magnetism sensitive part 8a formed by winding a coil 3 around a magnetic core layer 8 made of the soft magnetic material, and magnetism collective part 8b connected to respective ends of the magnetism sensitive part 8a for guiding magnetic fluxes to the magnetism sensitive part 8a.

The magnetism collective part 8b are a pair of magnetism collective part each in a shape of a long strip, formed by the magnetic core layer 8 of integrally with the magnetism sensitive part 8a, extending in a direction orthogonal to the longitudinal direction of the magnetism sensitive part 8a, and respective central parts of the magnetism collective part 8b, in the longitudinal direction thereof, are individually connected with the respective ends of the magnetism sensitive part 8a.

In a whole shape of the magnetic core layer 8, assuming that a length of it along the X-direction which is the longitudinal direction of the magnetism sensitive part 8a shown in FIG. 1, is A, and a length of the magnetism collective part 8b along the Y-direction which is the direction orthogonal to the longitudinal direction of the magnetism sensitive part 8a, is B, the magnetic core layer 8 is preferably formed such that a value of B/A falls in a range of 0.8 to 1.5.

Further, assuming that a length of the magnetism sensitive part 8a, along the Y-direction, which is the direction orthogonal to the longitudinal direction thereof, is C, the magnetic core layer 8 in its entirety is preferably formed such that a value of C/B falls in a range of 0.033 to 0.200. The reason for those will be described later in this description.

A sectional structure of the magnetism sensitive part 8a of the magnetic sensor element 1 is described hereinafter with reference to FIG. 2. As shown in FIG. 2, with the magnetic sensor element 1, the magnetic core layer 8 made of the soft magnetic material, such as a permalloy film, and so forth, is disposed over an insulated surface of a nonmagnetic base 2 through a lower insulation layer 6, and an upper insulation layer 10 is formed over the magnetic core layer 8.

The coil 3 is a thin-film coil comprising a plurality of upper coil thin-films 12 provided on a surface (the upperside surface) of the upper insulation layer 10 formed on one (the upperside surface in FIG. 2) of principal surfaces of the magnetic core layer 8, opposite from the magnetic core layer 8, and a plurality of lower coil thin-films 4 provided on a surface (the underside surface) of a lower insulation layer 6 formed on the other (the underside surface in FIG. 2) of the principal surfaces of the magnetic core layer 8, opposite from the magnetic core layer 8. The protection film 14 is formed over the upper insulation layer 10 and the upper coil thin films 12.

The upper coil thin-films 12 and the lower coil thin-films 4 are metal thin-films having high electrical conductivity. As shown in FIG. 3, the respective lower coil thin-films 4 and the adjacent upper coil thin-films 12 are connected together, at one end side and the other end side thereof, in the transverse direction of the magnetism sensitive part 8a, respectively, so as to be alternately and sequentially continuous with each other, thereby forming two thin-film coils helically wound around the magnetism sensitive part 8a of the magnetic core layer 8, respectively. In FIGS. 1 and 2, the thin-film coil showing with hatching is an excitation coil 3a while the thin-film coil showing without hatching is a detection coil 3b.

Electrode pads 15 and 16 are connected to respective ends of the excitation coil 3a, and electrode pads 17 and 18 are connected to respective ends of the detection coil 3b.

Then, an excitation current is caused to flow to the excitation coil 3a formed of the lower coil thin-films 4 and the upper coil thin-films 12 by applying a voltage across the electrode pads 15 and 16, thereby causing the magnetic core layer 8 to be excited. Now, the reason why the excitation coil 3a made up of the metal thin-films is formed at the central part (the magnetism sensitive part 8a) of the magnetic sensor element 1 is to cause excitation of the magnetic core layer 8 to occur only at the magnetism sensitive part 8a. Further, because the lower insulation layer 6 in FIG. 2 can be formed to a thickness on the order of several μm, and a gap between the magnetic core layer 8 and the upper surface of the upper coil thin-films 12 can also be rendered on the order of several μm, the excitation current flowing through the thin-film coil is effectively applied to the magnetic core layer 8.

By the agency of a triangular wave magnetic field produced by flow of a triangular wave current as the excitation current, the magnetic core layer 8 repeats magnetization saturation and magnetization reversal along a B-H curve, and since a pulse-like output is generated at the time of the magnetization reversal, the pulse-like output is detected by the detection coil 3b.

The magnetism collective part 8b works for concentrating an external magnetic field in order to cause many magnetic fluxes to flow into the magnetism sensitive part 8a, and if the magnetic sensor element 1 is structured such that a ratio of a length B of the magnetism collective part 8b in the Y-direction, to a length A of the magnetic core layer 8 in the X-direction, that is, the value of B/A is in a range of 0.8 to 1.5, it becomes possible to accurately detect geomagnetism even though the magnetic sensor element 1 is reduced in size.

The magnetic core layer 8 is preferably the permalloy film composed mainly of iron (Fe) and nickel (Ni), or a soft magnetic film composed mainly of iron, nickel, and cobalt (Co), formed by sputtering or plating.

Evaluation on the Magnetic Sensor Element by Testing

Now, there are described hereinafter results of evaluation on magnetic characteristics of the magnetic sensor element 1 according to the invention when reduced in size.

Table 1 below shows the results of the evaluation on working examples of the magnetic sensor element 1 according to the invention, obtained by varying a length A of the magnetic core layer 8 of the magnetic sensor element 1 in the X-direction, and a length B of the magnetism collective part 8b, in the Y-direction, respectively. In the case of the present evaluation, the length C of the magnetism sensitive part 8a in the Y-direction, is fixed to 100 μm.

TABLE 1

|  | length A in X-direction (μm) | length B in Y-direction (μm) | B/A | detection signal state | S/N ratio | detection pulse width |
|---|---|---|---|---|---|---|
| convent. tech. 1 | 3000 | 300 | 0.1 | ○ | ○ | ○ |
| convent. tech. 2 | 1000 | 100 | 0.1 | X | X | X |
| a | 1000 | 600 | 0.6 | X | X | X |
| b | 1000 | 800 | 0.8 | Δ | Δ | ○ |
| c | 1000 | 1000 | 1.0 | ○ | ○ | ○ |
| d | 1000 | 1200 | 1.2 | ○ | ○ | ○ |
| e | 1000 | 1500 | 1.5 | Δ | ○ | Δ |
| f | 1000 | 1700 | 1.7 | X | ○ | X |

Remarks:
"covent. tech." stands for conventional technology
"length A" stands for a length of the magnetic sensor 1
"length B" stands for a length of the magnetism collective part 8b In Table 1 as above, a detection signal state adopts as evaluation indicators, an S/N ratio (magnitude of a pulse signal) of a detection signal obtained by the detection coil 3b upon reversal of the magnetization of the magnetism sensitive part 8a, and a detection pulse width (sharpness of the signal). The detection signal state where the detection pulse is large and the S/N ratio is high while the detection pulse width is sharp is indicated by symbol "○", the detection signal state where at least one of the indicators is slightly insufficient (Δ) is indicated by symbol "Δ", and the detection signal state where at least one of the indicators is insufficient (x) is indicated by symbol "x".

Figure 24:
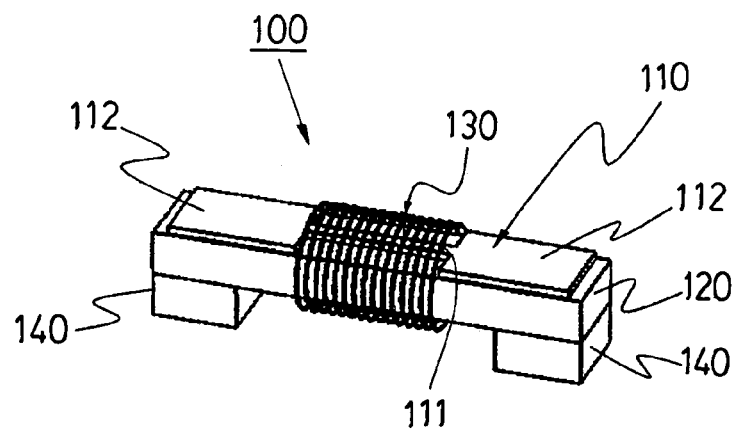
FIG. 24 is a perspective view showing an example of a conventional magnetic sensor element.
Figure 25:
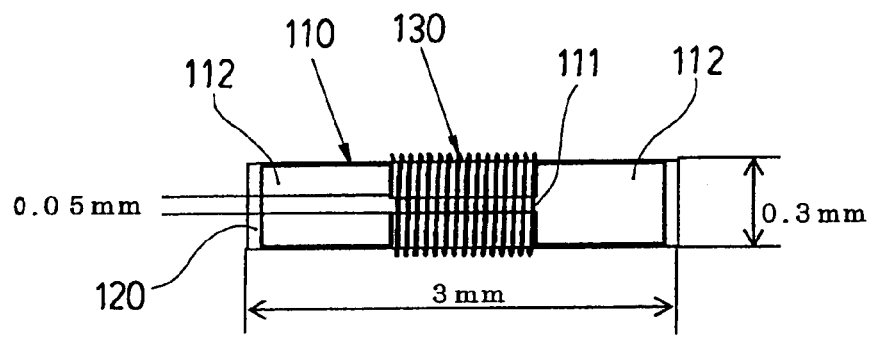
FIG. 25 is a plan view showing a size of the conventional magnetic sensor element.
Figure 26:
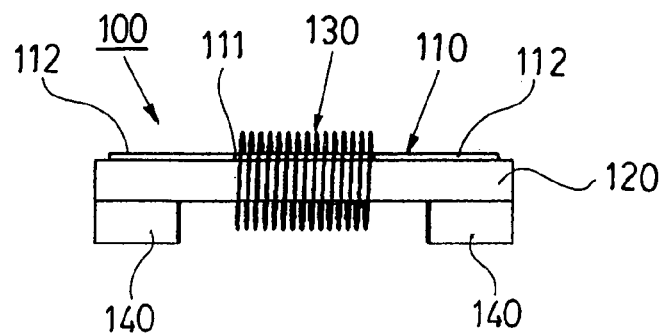
FIG. 26 is a side view of the conventional magnetic sensor element.
Figure 27:
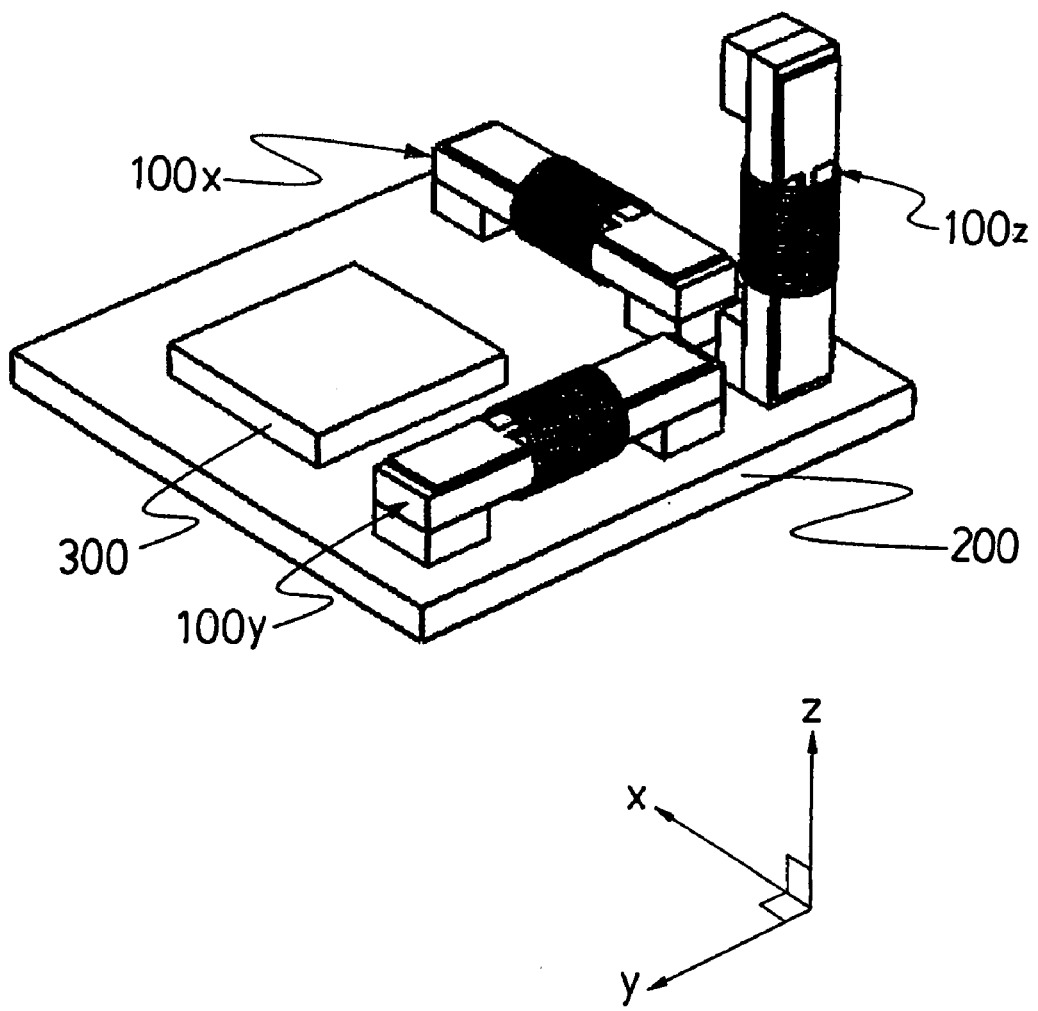
FIG. 27 is a perspective view showing an example of an electronic directional measuring device made up by a conventional triaxial magnetic sensor.

As shown in Table 1, an excellent detection signal can be obtained if B/A, which is the ratio of a length B of the magnetism collective part 8b in the Y-direction to a length A of the magnetic core layer 8 of the magnetic sensor element 1 in the X-direction, is 0.1, where the magnetic core layer has a length of 3000 μm, as with the case of the conventional technology 1 (the structure as disclosed in Patent Document 1: refer to FIGS. 24 to 26). However, if the element in the present form is reduced in size such that the length of the magnetic core layer is reduced to 1000 μm with B/A being kept at 0.1 (the case of the conventional technology 2), the detection pulse width as well as the S/N ratio deteriorates, thereby rendering it impossible to detect geomagnetism.

Thus, it is evident that with the present form of the element, according to the conventional technology 1, if the length of the element in the X-direction, is reduced to 1000 μm or less, the element cannot function as the magnetic sensor element. Similarly, as with the case of a sample a in Table 1, even when B/A was set to 0.6, a detection pulse width as well as an S/N ratio was insufficient, so that geomagnetism could not be detected.

Meanwhile, as with the cases of the working examples of the magnetic sensor element according to the present invention, samples b to e, shown in Table 1, an excellent detection signal could be obtained by setting B/A in the range of 0.8 to 1.5, more preferably in a range of 1.0 to 1.2, even if the length of the magnetic core layer in the X-direction was 1000 μm, so that it is evident that the geomagnetism could be detected.

Further, as shown in the case of a sample f in Table 1, when B/A was at 1.7, a detection pulse turned larger in width and although an S/N ratio was found high, so that it is evident that there occurred deterioration in sensitivity.

It has turned out from the results of the evaluations described as above that the detection signal excellent in waveform can be obtained if the length B of the magnetism collective part 8b in the Y-direction, is in a range of 800 to 1500 μm, thereby keeping B/A in the range of 0.8 to 1.5, when the length of the magnetic core layer in the X-direction is on the order of 1000 μm.

Next, Table 2 below shows results of evaluation on the magnetic characteristics when the length A of the magnetic core layer in the X-direction of each of the magnetic sensor elements shown Table 1 is kept to 800 μm. Table 2 below shows results of the evaluation, obtained by variously changing the length B of the magnetism collective part 8b in the Y-direction while keeping the length A of the magnetic core layer in the X-direction fixed to 800 μm,. In the case of the present evaluation, the length of the magnetism sensitive part 8a in the Y-direction is fixed to 100 μm.

Symbols "○", "Δ", "x", shown in Table 2 indicating evaluation results, each have significance identical to that for those in Table 1.

TABLE 2

| | length A in X-direction (μm) | length B in Y-direction (μm) | B/A | detection signal state | S/N ratio | detection Pulse width |
|---|---|---|---|---|---|---|
| a | 800 | 480 | 0.6 | X | X | X |
| b | 800 | 640 | 0.8 | Δ | Δ | ○ |
| c | 800 | 800 | 1.0 | ○ | ○ | ○ |
| d | 800 | 960 | 1.2 | ○ | ○ | ○ |
| e | 800 | 1200 | 1.5 | Δ | ○ | Δ |
| f | 800 | 1360 | 1.7 | X | ○ | X |

As with the case of a sample a shown in Table 2, when B/A was set to 0.6, a detection pulse became smaller while an S/N ratio deteriorated, so that it was not possible to detect geomagnetism. On the other hand, with the working examples according to the invention, samples a to e as shown in Table 2, an excellent detection signal could be obtained by setting B/A in the range of 0.8 to 1.5, more preferably in a range of 1.0 to 1.2, so that it is evident that geomagnetism could be detected.

Further, as with the case of a sample f shown in Table 2, when B/A was set to 1.7, a detection pulse width became wide although an S/N ratio was found high, so that it is evident that sensitivity turned less sharp. Thus, It has turned out that a detection signal excellent in waveform can be obtained by keeping the length B of the magnetism collective part 8b, in the Y direction, in a range of 640 to 1200 μm that is, by setting B/A in the range of 0.8 to 1.5, even when the length A of the magnetic core layer in the X-direction is set to on the order of 800 μm, as with the case of the length A being set to 1000 μm, (refer to Table 1).

In the forgoing description, mention has been made of a problem that the detection pulse width of the detection signal becomes wide, which can affect the characteristics of the magnetic sensor element, such as resolution and sensitivity. As described above, since the magnetic sensor element 1 according to the invention is based on the principle of operation that the detection pulse makes a shift according to a magnetic field, there arises a problem that a shift amount of the pulse becomes smaller or the detection pulse does not linearly shift against the magnetic field if the detection pulse width becomes wide.

Further, if the length B of the magnetism collective part 8b in the Y-direction shown in FIG. 1, is excessively large, there arises a concern about deterioration in directivity. That is, while it is intended to detect a certain magnetic field in the X-direction, there is no denying a possibility that magnetic fluxes flow in from the Y-direction side as well. Further, if the length B of the magnetism collective part 8b in the Y-direction becomes large, this will cause an increase in size of the magnetic sensor element, in the direction of the plane thereof, which is naturally disadvantageous from the viewpoint of reduction in size. Accordingly, as the case of the present invention, in attempting to reduce the size of the element, if the element is designed such that B/A is kept in the range of 0.8 to 1.5, this will enable an excellent detection signal to be obtained from the magnetic sensor element 1 to thereby accurately detect geomagnetism.

Furthermore, in the forgoing description, mention has been made that the length of the magnetism sensitive part 8a in the Y-direction is 100 μm, however, with the magnetic sensor element 1 according to the present invention, also a magnetic field (by geomagnetism) can be sufficiently detected by setting a ratio of the length C of the magnetism sensitive part 8a in the Y-direction to the length B of the magnetism collective part 8b in the Y-direction to a range of 0.033 to 0.200, even if the element is reduced in size. Further, it is assumed that the magnetic core layer 8 of the magnetic sensor element 1 according to the present invention is formed so as to have a substantially uniform thickness in whole.

Table 3 below shows results of the evaluation, obtained by variously changing a length (width) C of the magnetism sensitive part 8a in the Y-direction of the magnetic sensor element 1, while keeping the length B of the magnetism collective part 8b in the Y-direction, fixed to 1000 μm. In this case, a length of the magnetic core layer 8 in the X-direction was fixed to 800 μm.

TABLE 3

| | length C in Y-direction (μm) | length B in Y-direction (μm) | C/B | detection signal state | S/N ratio | detection pulse width |
|---|---|---|---|---|---|---|
| a | 250 | 1000 | 0.250. | X | ○ | X |

TABLE 3-continued

| | length C in Y-direction (μm) | length B in Y-direction (μm) | C/B | detection signal state | S/N ratio | detection pulse width |
|---|---|---|---|---|---|---|
| b | 200 | 1000 | 0.200 | Δ | ○ | Δ |
| c | 100 | 1000 | 0.100 | ○ | ○ | ○ |
| d | 50 | 1000 | 0.050 | ○ | ○ | ○ |
| e | 33 | 1000 | 0.033 | Δ | Δ | ○ |
| f | 25 | 1000 | 0.025 | X | X | ○ |

Remarks:
"length C" stands for a length (width) of the magnetism sensitive part 8a In Table 3 as above, an S/N ratio (magnitude of a pulse signal) and a detection pulse width (sharpness of the signal) are adopted as evaluation indicators for the state of the detection signal, as previously described. The detection signal state where a detection pulse is large and an S/N ratio is high while a detection pulse width is sharp is indicated by symbol "○", the detection signal state where at least one of the indicators is slightly insufficient (Δ) is indicated by symbol "Δ", and the detection signal state where at least one of the indicators is insufficient (x) is indicated by symbol "X".

As with the case of a sample a shown in Table 3, when the length C of the magnetism sensitive part 8a in the Y-direction was 250 μm, and the length B of the magnetism collective part 8b in the Y-direction was on the order of 1000 μm, that is if a ratio of the length C of the magnetism sensitive part 8a to the length B of the magnetism collective part 8b, that is C/B was set to 0.250, the waveform of the detection pulse became dull and wide although the S/N ratio was high, so that it is evident that there occurred deterioration in the characteristics of the magnetic sensor element, such as resolution and sensitivity.

In contrast, as with the case of a sample b shown in Table 3, when the ratio of the length of the magnetism sensitive part 8a to the length of the magnetism collective part 8b in the Y-direction, that is C/B was set to 0.200, the S/N ratio was found excellent and the detection pulse width became fairly sharp, so that it is evident that the characteristics of the magnetic sensor element was improved. Further, as with the case of samples c and d in Table 3 when the ratio of the length of the magnetism sensitive part 8a to the length of the magnetism collective part 8b in the Y-direction, that is C/B was set to a range of on the order of 0.050 to 0.100, it was possible to render the detection pulse width becoming sharpest, and to maintain the S/N ratio at a high level, so that it is evident that geomagnetism can be more stably detected.

Further, as with the case of a sample f in Table 3, when the length C of the magnetism sensitive part 8a in the Y-direction was 25 μm, and the length B of the magnetism collective part 8b in the Y-direction was on the order of 1000 μm, that is, if the ratio of the length C of the magnetism sensitive part 8a to the length B of the magnetism collective part 8b in the Y-direction was set to 0.025, the detection signal necessary for detection of the magnetic field becomes too low in intensity, resulting deterioration in an S/N ratio, it is evident that it becomes impossible to detect geomagnetism. In contrast, as with the case of a sample e in Table 3, when the ratio of the length in the Y-direction of the magnetism sensitive part 8a to the magnetism collective part 8b was set to 0.033, the S/N ratio was improved, thereby enabling geomagnetism to be detected.

It has turned out from the results described as above, that the C/B ratio is preferably set to a range of 0.033 to 0.200, in order to obtain an excellent detection signal and to detect the geomagnetism in the case of achieving reduction in size of the magnetic sensor element.

Thus, with adoption of a configuration according to the invention, the magnetic sensor element 1 can be reduced in size. The configuration has a significant feature in that the magnetic core layer 8 is in a shape resembling the letter H, with dimensions specified in predetermined ranges, in the X-direction and the Y-direction and the magnetic sensor element 1 although small in size is capable of gaining an output sufficient for detection of the geomagnetism. Further, the reason why the magnetic sensor element 1 has the output sufficient for the detection of the geomagnetism is because the length of the magnetism collective part 8b in the Y-direction is adequately set in relation to the length of the element, and further, the length (width) of the magnetism sensitive part 8a in the Y-direction is adequately set in relation to the length of the magnetism collective part 8b in the Y-direction.

Further, according to the configuration of the invention, the coil 3 is made up of the thin-film coils composed of the lower coil thin-films 4 and the upper coil thin-films 12, which differs in configuration from a conventional winding type coil. As a result, even with the structure where the length of the magnetism collective part 8b in the Y-direction is increased, the magnetic core layer 8 can be effectively excited, thereby enabling the element to achieve the detection of the geomagnetism, even if reduced in size.

Next, Table 4 below shows results of the evaluation on specimens, obtained by variously changing a length B of the magnetism collective part 8b in the Y-direction, when the magnetic sensor element was reduced in size by keeping a length A of the magnetic core layer 8 in the X-direction at 650 μm. In this case, a length (width) of the magnetism sensitive part 8a in the Y-direction in FIG. 1, was fixed to 60 μm.

TABLE 4

| | length A in X-direction (μm) | length B in Y-direction (μm) | B/A | detection signal state | S/N ratio | detection pulse width |
|---|---|---|---|---|---|---|
| onvent. tech. 3 | 650 | 60 | 0.1 | X | X | X |
| i | 650 | 390 | 0.6 | X | X | X |
| ii | 650 | 520 | 0.8 | Δ | Δ | ○ |
| iii | 650 | 650 | 1.0 | ○ | ○ | ○ |
| Iv | 650 | 780 | 1.2 | ○ | ○ | ○ |
| v | 650 | 910 | 1.4 | Δ | ○ | Δ |
| vi | 650 | 1300 | 2.0 | X | ○ | X |

Figure 4:
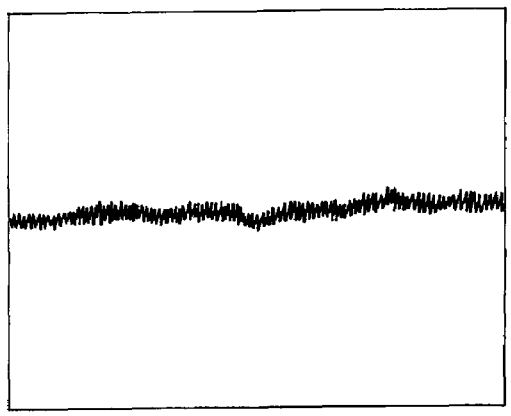
FIGS. 4 to 6 are waveform charts showing respective waveforms of detection pulses in the respective cases of samples i, iv, and vi, shown in Table 4.
Figure 5:
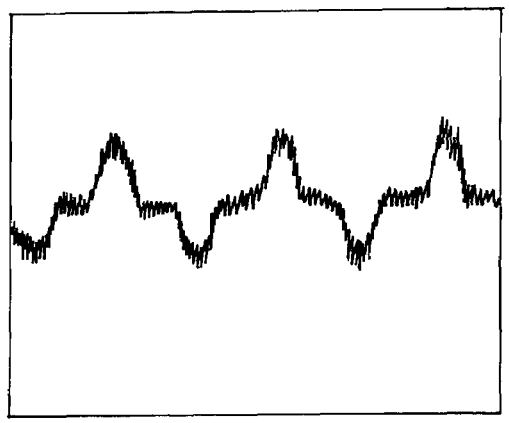
Figure 6:
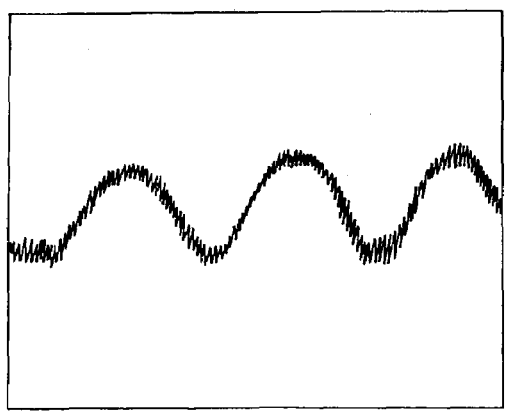

FIGS. 4 to 6 are showing results of tests, which are respective detection waveforms as measured. The respective waveforms in the figures indicate waveforms of detection pulses only, excluding a triangular wave applied to the coil. In FIGS. 4 to 6, there are shown the respective waveforms of the detection pulses in the respective cases of three kinds of the samples i, iv and vi, shown in Table 4.

In the case of the sample i shown in Table 4, where the length B of the magnetism collective part 8b in the Y-direction was 390 μm with B/A being set to 0.6, a pulse had an poor S/N ratio as shown in FIG. 4, so that it was difficult to detect the geomagnetism.

On the other hand, as with the cases of samples ii to v according to the present invention, shown in Table 4, an excellent detection signal could be obtained by setting B/A in the range of 0.8 to 1.5, so that the geomagnetism could be detected.

In the case of a sample iv shown in Table 4, where the length B of the magnetism collective part 8b in the Y-direction was 780 μm, with B/A being set to 1.2, it was possible to obtain a clear detection pulse waveform as shown in FIG. 5.

Then, as the case of a sample vi shown in Table 4, where B/A is increased to on the order of 2.0, a detection pulse was found to have a detection pulse waveform slightly wider than the detection pulse waveform shown in FIG. 5, as shown in FIG. 6, although an S/N ratio was found high. Furthermore, in this case, the magnetic sensor element itself is at an disadvantage even from the viewpoint of miniaturization, because the length B in the Y-direction becomes fairly large as compared with the length A in the X-direction.

Next, when the magnetic sensor element was reduced in size by keeping a length A of the magnetic core layer 8 in the X-direction at 650 as with the previous case, results of the evaluation on samples, obtained by variously changing the length (width) C of the magnetism sensitive part 8a in the Y-direction from 20 to 200 μm, while the length B of the magnetism collective part 8b in the Y-direction fixed at 780 μm, are shown in Table 5.

TABLE 5

|     | length C in Y-direction (μm) | length B in Y-direction (μm) | C/B | detection signal state | S/N ratio | detection pulse width |
| --- | --- | --- | --- | --- | --- | --- |
| i   | 200 | 780 | 0.25  | X | ◯ | X |
| ii  | 150 | 780 | 0.20  | Δ | ◯ | Δ |
| iii | 80  | 780 | 0.10  | ◯ | ◯ | ◯ |
| iv  | 40  | 780 | 0.05  | ◯ | ◯ | ◯ |
| v   | 25  | 780 | 0.033 | Δ | Δ | ◯ |
| vi  | 20  | 780 | 0.025 | X | X | ◯ |

Figure 7:
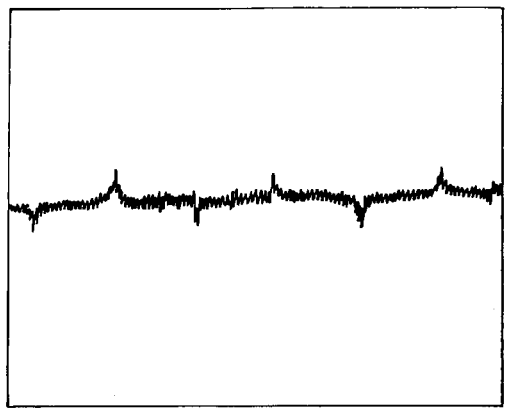
FIGS. 7 to 9 are waveform charts showing respective waveforms of detection pulses in the respective cases of samples vi, iii, and i, shown in Table 5.
Figure 8:
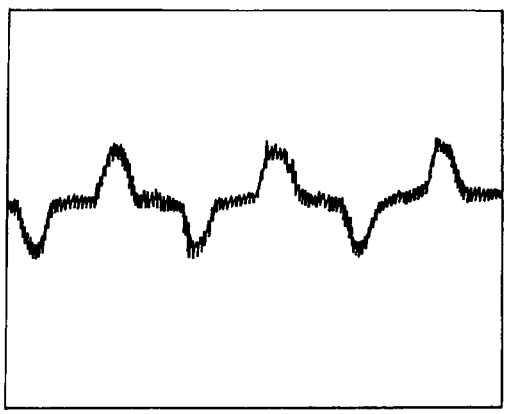
Figure 9:
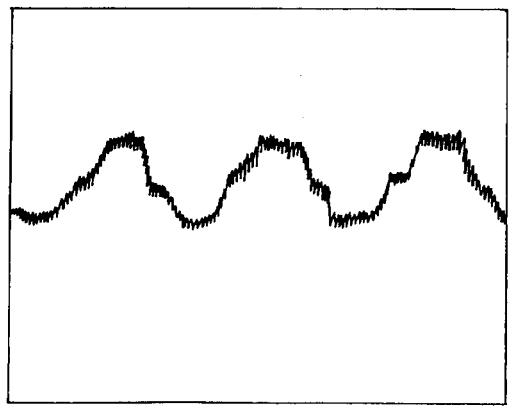

FIGS. 7 to 9 are waveform charts similar to those in FIGS. 4 to 6, respectively, showing results of measurements on respective detection waveforms in the respective cases of samples vi, iii and i shown in Table 5.

It is evident on the basis of the results of measurements that in the case of the sample iii shown in Table 5, that is, in the case where the length C of the magnetism sensitive part 8a in the Y-direction, was 80 μm, thereby setting C/B to 0.1, it was possible to obtain a clear detection pulse waveform as shown in FIG. 8.

However, in the case of the sample i shown in Table 5, that is, in the case where the length C of the magnetism sensitive part 8a in the Y-direction, was 200 μm, thereby setting C/B to 0.25, a detection pulse waveform was becomes wide shape itself although an S/N ratio was found high, as shown in FIG. 9, so that it is evident that there occurred deterioration in respect of resolution and sensitivity.

Further, in the case of the sample vi shown in Table 5, that is, in the case where the length C of the magnetism sensitive part 8a in the Y-direction, was 20 μm, thereby setting C/B to 0.025, a detection pulse became shape as shown in FIG. 7, but it is evident that an S/N ratio became smaller. Furthermore, if on the order 20 μm, is adopted for the length C of the magnetism sensitive part 8a, in the Y-direction, it becomes difficult to manufacture the magnetism sensitive part 8a with satisfactory reproducibility. More specifically, there occurs a problem attributable to pattering precision when a magnetic film is formed by plating to be subsequently patterned in the shape as to the embodiment of the present invention by wet etching. In case the etching is carried out for a slightly longer time period, there can occur the case where a pattern of the magnetism sensitive part 8a is lost, and it is therefore difficult to stably control a shape thereof. Hence, the case of the sample vi shown in Table 5 is not preferable not only because of a problem concerning the S/N ratio, but also because of the problem attributable to the pattering precision.

It is evident on the basis of the results of the tests that an excellent detection signal can be obtained by the magnetic sensor element according to the present invention even if reduced in size, and C/B is preferably set to the range of 0.033 to 0.2 in order to detect the geomagnetism with reliability.

Thus, with the adoption of the configuration according to the invention, the magnetic sensor element can be reduced in size. The configuration has the significant feature in that the magnetic core layer 8 is in the shape resembling the letter H, and the magnetic sensor element although small in size has the output sufficient for detection of the geomagnetism. The reason why the magnetic sensor element 1 has the output sufficient for the detection of the geomagnetism is because the length of the magnetism collective part 8b, in the Y-direction, is adequately set in relation to the length of the magnetic core layer 8, in the X-direction, and further, the length (width) of the magnetism sensitive part 8a, in the Y-direction, is adequately set in relation to the length of the magnetism collective part 8b, in the Y-direction.

Embodiment of an Electronic Directional Measuring Device

Figure 10:
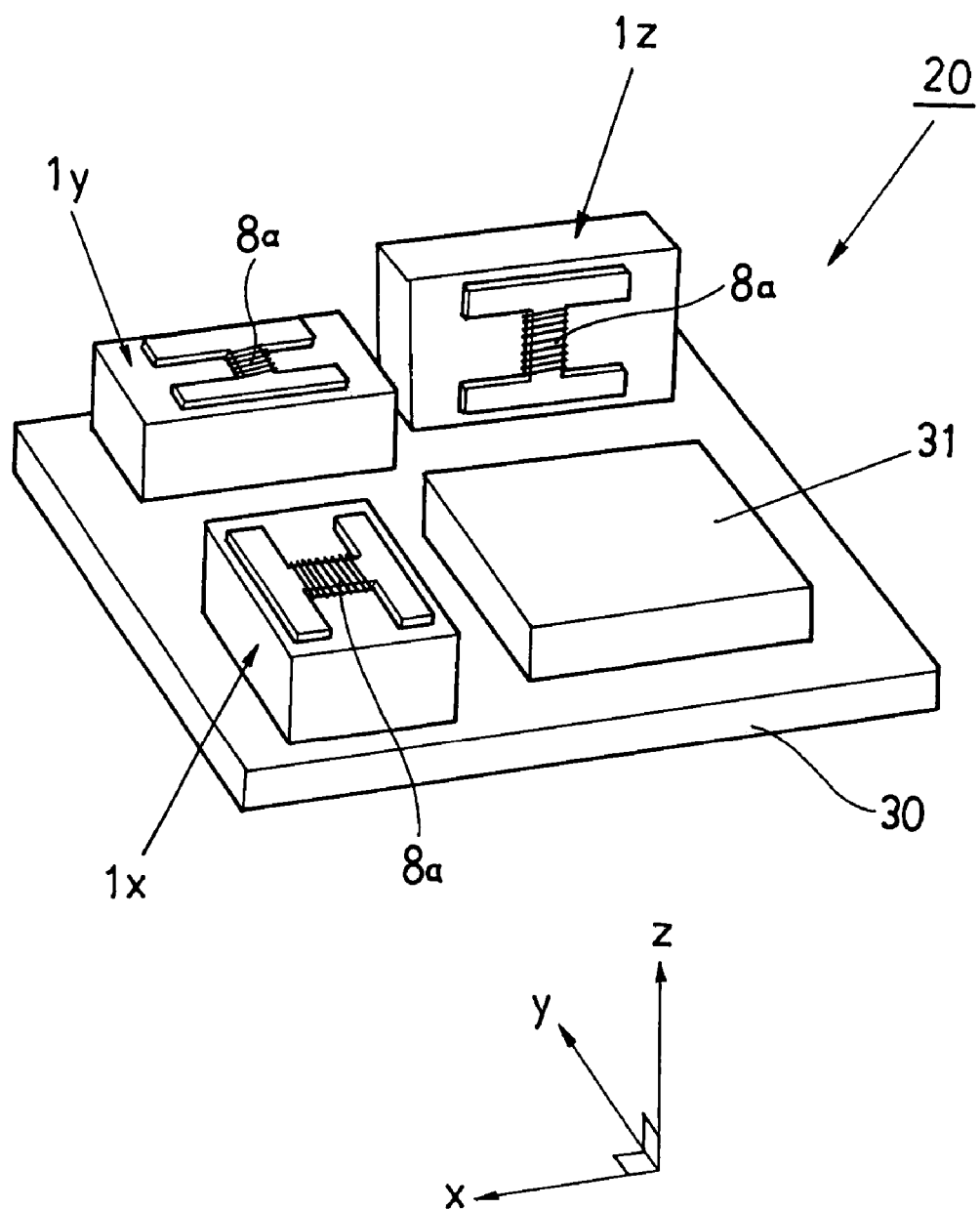
FIG. 10 is a perspective view showing the concept of an electronic directional measuring device made up of the magnetic sensor elements according to the invention.

Now, there is described hereinafter an electronic directional measuring device comprising the magnetic sensor elements according to the invention with reference to the accompanying drawings. FIG. 10 is a perspective view showing the concept of the electronic directional measuring device made up by using the magnetic sensor elements according to the invention.

As shown in FIG. 10, the electronic directional measuring device 20 is made up by mounting three units of magnetic sensor elements identical in configuration to the magnetic sensor element 1 according to the invention, that is, an x-axis magnetic sensor element 1x, a y-axis magnetic sensor element 1y, and a z-axis magnetic sensor element 1z, together with a magnetic sensor IC 31 for driving those magnetic sensor elements, on an epoxy base 30.

The x-axis magnetic sensor element 1x, the y-axis magnetic sensor element 1y, and the z-axis magnetic sensor element 1z are disposed such that the longitudinal directions of the respective magnetism sensitive parts 8a of those magnetic sensor elements run along the x-axis, the y-axis, and the z-axis, respectively, so as to cross each other at right angles, thereby making up a triaxial magnetic sensor.

When an excitation current is caused to flow to the respective excitation coils 3a of the magnetic sensor elements 1x, 1y, and 1z by the magnetic sensor IC 31, an azimuth can be worked out on the basis of the detection signals outputted from the detection coil 3b.

Then, a package of the directional measuring device 20 is made up by coating the x-axis magnetic sensor element 1x, the y-axis magnetic sensor element 1y, and the z-axis magnetic sensor element 1z with a synthetic resin (not shown) for protection thereof, and by providing the epoxy base 30 having those magnetic sensor elements mounted thereon with a power supply terminal for driving the magnetic sensor IC 31, an output terminal for outputting data (signals) on the azimuth as worked out on the basis of the respective detection signals of the magnetic sensor elements, and so forth.

With the directional measuring device 20, the magnetic sensor element 800 μm in height, such as the example shown in Table 2, is used as the z-axis magnetic sensor element 1z, so that the geomagnetism can be detected if the epoxy base 30 is formed to have a thickness 200 μm, or less, and the directional measuring device 20 can be reduced to 1 mm or less in all height.

Thus, if the triaxial magnetic sensor serving as the directional measuring device is made up by mounting three units of the magnetic sensor elements according to the invention therein, this will enable the directional measuring device made up of the triaxial magnetic sensor to be reduced in size and height, thereby rendering it possible to mount the directional measuring device in a mobile terminal.

Furthermore, it is to be pointed out that two units of the magnetic sensor elements according to the invention may be disposed on a nonmagnetic base such that respective directions thereof cross each other at right angles, thereby making up a directional measuring device made up of a biaxial magnetic sensor. Otherwise, not less than four units of the magnetic sensor elements according to the invention may be disposed on a nonmagnetic base, thereby making up a directional measuring device with higher precision.

Method for Manufacturing the Magnetic Sensor Element

Now, a method for manufacturing the magnetic sensor element according to the invention is described in detail hereinafter with reference to FIGS. 11 to 15, and FIG. 2. Those figures show respective process steps of the method for manufacturing the magnetic sensor element 1 described with reference to FIGS. 1 to 3, each of the figures being a sectional view corresponding to the section of the magnetic sensor element 1, along line II-II in FIG. 1.

Figure 11:
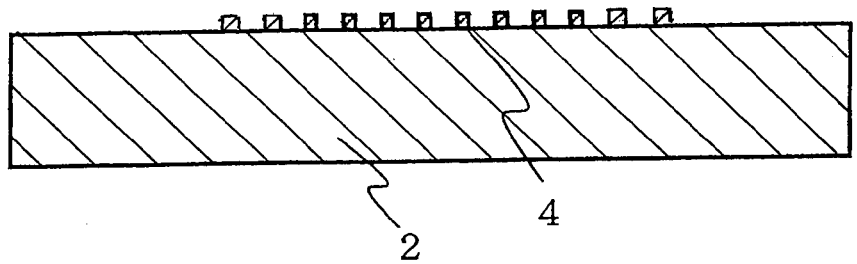
FIGS. 11 to 15 each are a sectional view similar to FIG. 2, sequentially showing respective process steps of a method for manufacturing the magnetic sensor element according to the invention.

First, a nonmagnetic base 2 shown in FIG. 11 is prepared. The nonmagnetic base 2 is made up of a silicon wafer with a surface having a silicon oxide film about 1.0 μm in thickness. An Au sputter film to serve as electrodes for forming an Au film by plating, which becomes the lower coil thin-films 4 and the electrode pads 15 to 18 shown in FIGS. 1 to 3, is formed to a predetermined thickness throughout an upper surface of the nonmagnetic base 2. Further, because of weak adhesiveness between the silicon oxide film and the Au film, a chromium (Cr) film as an intermediate film is preferably formed therebetween in order to reinforce adhesiveness. In the following explanation, description on the electrode pads 15 to 18 is omitted, however, it is to be understood that the electrode pads 15 to 18 are processed and formed concurrently with the lower coil thin-films 4 in all the steps of the method for manufacturing the magnetic sensor element 1.

Then, the Au sputter film is covered with a resist except portions thereof corresponding to the respective lower coil thin-films 4 shown in FIG. 11, and the Au film is formed into a pattern of the lower coil thin-films 4 not covered with the resist, so as to have a thickness of several μm, by electroplating. Thereafter, the resist, the Au film as a common electrode, and the Cr film are peeled off and etched, thereby forming the respective lower coil thin-films 4 made up of the Au film, in a desired shape, as shown in FIG. 11.

In the figure, for the sake of brevity, there is shown the number of the lower coil thin-films, necessary for forming the thin-film coil of the same number of turns as that in FIG. 1, however, in practice, the thin-film coil made up of the lower coil thin-films 4 and the upper coil thin-films 12 is, for example, about 2 μm, in thickness, and about 5 μm, in width, and the coil has the number of turns on the order of 50.

Figure 12:
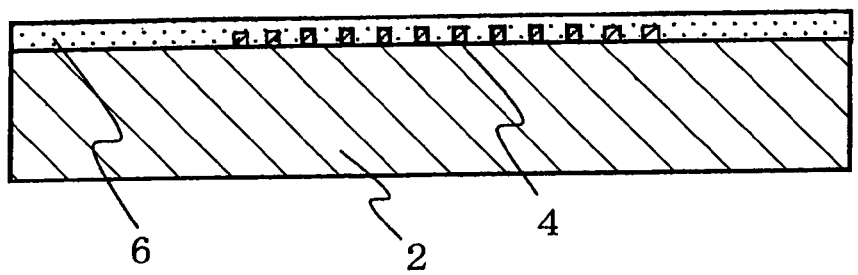

Next, as shown in FIG. 12, there is formed the lower insulation layer 6 for isolating the lower coil thin-films 4 from the magnetic core layer 8. For the lower insulation layer 6, use is made of polyimide which is a photosensitive negative type material, the lower insulation layer 6 is. formed to a thickness of several μm in such a way as to cover the lower coil thin-films 4, and applied heat treatment thereto at a temperature in a range of about 300 to 350° C. for one hour.

Next, in order to form a permalloy film to serve as the magnetic core layer 8 by plating, a sputter film (not shown) serving as an under-layer is formed over the lower insulation layer 6. Forming the sputter film is carried out in a state where a certain static magnetic field at intensity of several thousand (A/m) is applied in the Y-direction in FIG. 1. In this case, the sputter film is formed to a thickness on the order of about 0.1 μm.

And after the formation of the sputter film, the permalloy film is formed by plating in the same static magnetic field as that in the case of forming the sputter film.

Figure 13:
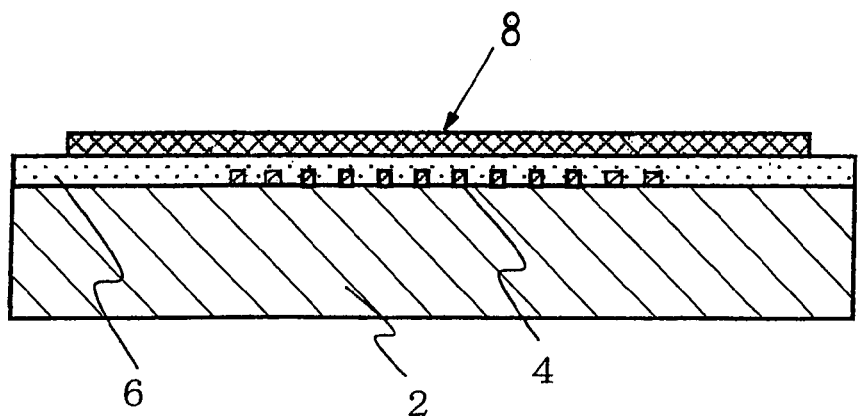

For a plating apparatus, use is made of a circulation-type plating apparatus designed to achieve excellent distribution in film-thickness, and a sulfuric-acid based plating bath composed of nickel sulfate, iron sulfate, and so forth is used as a plating-solution. At the time of the plating, use is made of a plating jig with a magnet embedded therein so as to enable the static magnetic field at the intensity of several thousands (A/m) in the Y-direction in FIG. 1 to be applied in this case as well. The permalloy film to serve as the magnetic core layer 8 is formed to a thickness on the order of 3 to 6 μm, as shown in FIG. 13 under a condition of current density at 25 mA/cm$^2$ and application time for 10 to 20 minutes.

Subsequently, in order to cause the permalloy film of the magnetic core layer 8, shown in FIG. 13, to be rendered into a shape resembling the letter H, as shown in FIG. 1, the shape incorporating the magnetism sensitive part 8a and the magnetism collective part 8b, a resist is used, and is patterned in such a way as to cover the shape resembling the letter H. Then, in order to remove unnecessary portions of the permalloy film, other than portions corresponding to the shape resembling the letter H, etching is applied thereto. An etchant composed of ferric chloride and hydrochloric acid is used in the etching. A pattern as desired can be obtained by executing the etching while stirring up the etchant.

An overall size of the magnetic core layer 8 formed in this way is set to, for example, 800 μm, in length in the X-direction and 1000 μm, in length in the Y-direction in FIG. 1, while the magnetism sensitive part 8a at the central part thereof is set to 600 μm in length in the X-direction and 100 μm, in length in the Y-direction, and each of the magnetism collective part 8b at the respective ends of the magnetic core layer 8 is set to 100 μm in length in the X-direction and 1000 μm in length in the Y-direction.

Now, a pattern is formed on the lower insulation layer 6, for forming respective openings for the electrode pads and the lower coil thin-films 4. It is, in theory, sufficient to pattern a resist in such a way as to expose only the respective lower coil thin-films 4 and the respective electrode pads, in which case the respective lower coil thin-films 4 and the respective electrode pads are exposed to plasma. A pattern is therefore formed such that portions of the resist remain on the upper surface of the magnetic core layer 8. Thereafter, portions of the polyimide film as the lower insulation layer 6, over the respective lower coil thin-films 4 and the respective electrode pads 16, are removed by plasma etching in an oxygen atmosphere. The resist is finally peeled off, and a workpiece in the shape shown in FIG. 1 can be obtained.

Next, in order to form the upper insulation layer 10, a photosensitive negative type polyimide is uniformly applied to the whole surface of the lower coil thin-films 4 and the magnetic core layer 8 by spin coating. Connection between the respective lower coil thin-films 4 and the respective upper coil thin-films 12 is implemented through the respective openings as previously described, and because there is the risk of interconnections being broken at respective edges of the upper insulation layer 10, owing to a difference in level, when forming the upper coil thin-films 12, the respective edges of the upper insulation layer 10 need to have smooth inclination. An exposure and development process is first applied to a polyimide film such that the respective lower coil thin-films 4 and the respective electrode pads are provided with openings, thereby forming the upper insulation layer 10 having a pattern as desired. At this point in time, respective edges of the upper insulation layer 10 are rectangular in shape.

Figure 14:
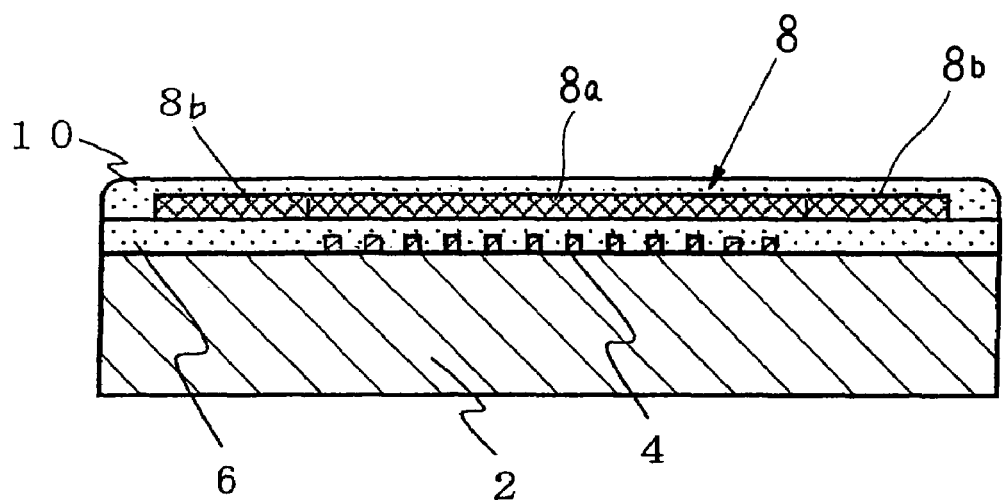

Thereafter, curing of the upper insulation layer 10 formed of polyimide is carried out. Whereupon respective edge shapes of the pattern become smooth because of polyimide's own weight upon the polyimide undergoing contraction due to the curing, and in particular, respective parts of the upper insulation layer 10, positioned along respective peripheries of the openings, can be formed an inclined shape. Further, the inclined shapes of the upper insulation layer 10, in the vicinity of the respective openings, are not shown in those figures for showing the process steps. Further, it is necessary that the certain static magnetic field is applied in the Y-direction shown in FIG. 1 at the time of this curing as well, thereby controlling magnetic domains of the magnetic core layer 8. Thus, the upper insulation layer 10 is formed as shown in FIG. 14.

Figure 15:
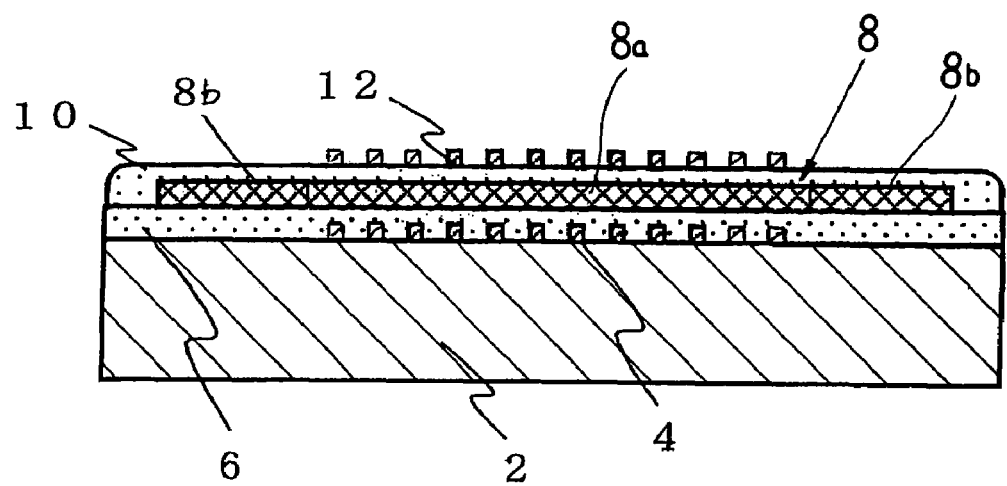

Further, as shown in FIG. 15, an Au film is formed to a thickness of several μm by plating to thereby form the upper coil thin films 12 as with the case of forming the lower coil thin-films 4 in order to form the coil to be wound around the magnetic core layer 8 by connecting the respective upper coil thin films 12 to the respective lower coil thin-films 4. With a structure thus formed, the respective upper coil thin-films 12 and the lower coil thin-films 4 are sequentially connected together, at respective ends thereof, in the transverse direction of the magnetism sensitive part 8a of the magnetic core layer, 8 as shown in FIGS. 1 and 3, and there is a concern that the interconnections can be broken at respective stepped edges of the upper insulation layer 10, however, since the respective edge shapes of the upper insulation layer 10 have inclination, and the stepped edges are rendered smooth, an interconnection pattern can be formed with ease.

Further, the thin-film coil thus formed, comprising a multitude of the lower coil thin-films 4 and upper coil thin-films 12, can be formed two coils helically wound around the magnetism sensitive part 8a of the magnetic core layer 8, respectively, that are formed by alternately connecting together the respective lower coil thin-films 4 and the adjacent upper coil thin-films 12, at one end side and the other end side thereof, in the transverse direction of the magnetic sensitive part 8a, so as to be alternately and sequentially continuous with each other, as is the case with the coil 3 according to the embodiment shown in FIGS. 1 and 3. One of the coils can be used as the excitation coil 3a while the other can be used the detection coil 3b.

Otherwise, one of a continuous coil may be formed by alternately and sequentially connecting together the respective lower coil thin-films 4 and the adjacent respective upper coil thin-films 12, at one end side and the other end side thereof, in the transverse direction of the magnetic sensitive part 8a, and even if the one of the coil is used as both the excitation coil and the detection coil, the coil is capable of effecting magnetization reversal of the magnetic core layer 8 and taking out the detection pulse.

In the final process step, the protection film 14 for protection of the magnetic sensor element is formed in such a way as to cover the upper insulation layer 10 and upper coil thin-films 12, as shown in FIG. 2, whereupon the magnetic sensor element 1 according to the invention is completed. Further, the protection films 14, is provided with openings at portions corresponding to the electrode pads 15 to 18.

Thereafter, a plurality of the magnetic sensor elements of the parallel flux gate type are mounted on the epoxy base 30 as shown in FIG. 10, and the respective magnetic sensor elements are connected to the magnetic sensor IC 31, whereupon the electronic directional measuring device 20 can be made up.

As described in the foregoing, with the magnetic sensor element according to the invention, the magnetic core layer 8, the lower coil thin-films 4, and the upper coil thin-films 12 can be formed by a thin-film deposition process, and the magnetic sensor element is therefore suited for mass production, reduction in cost, and so forth.

Further, with the embodiment described hereinbefore, there has been described an example where the magnetic core layer 8 is formed of an Fe—Ni alloy of a binary system, however, the magnetic core layer 8 can also be formed of an Fe—Ni—Co alloy of a ternary system by adding cobalt sulfate into the plating bath shown in the embodiment described hereinbefore. Further, the magnetic core layer 8 may be formed by sputtering a soft magnetic amorphous material. Furthermore, the magnetic core layer 8 is more preferably formed by depositing a soft magnetic film on a nonmagnetic film.

Still further, it has been described hereinbefore that the electrode pads 15 to 18, to serve as respective terminals of the coil 3 (the excitation coil 3a and the detection coil 3b, or the one length of the coil doubling as the excitation coil and the detection coil) provided around the magnetism sensitive part 8a of the magnetic sensor element 1, are formed on the same plane as that for the lower coil thin-films 4, however, the invention is not to be limited in scope thereto. For example, the electrode pads 15 to 18 may be deposited on the same plane as that for the upper coil thin-films 12, and over magnetism collective part 8b, so as to be formed on the upper insulation layer 10.

Examples of Magnetic Core Layer in Other Shapes

Now, examples of magnetic core layer of the magnetic sensor element according to the invention, in other shapes, are described hereinafter with reference to FIGS. 16 to 23. FIGS. 16 to 23 each are a plan view showing each of the examples of other magnetic core layer of the magnetic sensor element, differing in shape from each other, together with the coil. In those figures, the magnetic core layer, an magnetism sensitive part, magnetism collective part, and a coil are denoted by the same numerals as those denoting constituent parts according to the embodiment shown in FIG. 1 although respective shape thereof are different.

Figure 16:
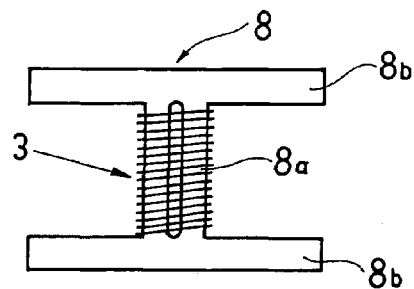
FIGS. 16 to 23 each are a plan view showing each of examples of other magnetic core layers of the magnetic sensor element, differing in shape from each other.

The magnetic core layer 8 shown in FIG. 16 is in the shape resembling the letter H, identical to that for the magnetic core layer 8 according to the embodiment shown in FIG. 1, and it is therefore possible to cause external magnetic fluxes to smoothly flow from the respective magnetism collective part 8b into the magnetism sensitive part 8a.

The magnetic core layer 8 shown in FIG. 16 differs from the magnetic core layer 8 shown in FIG. 1, a portion of the magnetic core layer 8 serving as the magnetism sensitive part 8a, is divided so as to two slender portions separated from each other, each portion is smaller in width than the magnetism sensitive part 8a shown in FIG. 1.

Figure 17:
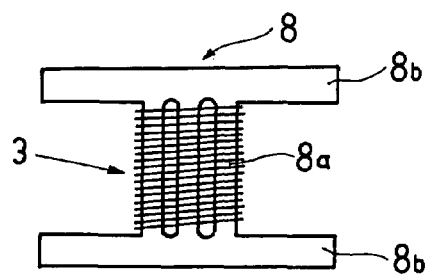

The magnetic core layer 8 shown in FIG. 17 is also in the shape resembling the letter H, but the magnetism sensitive part 8a thereof is divided so as to three slender portions separated from each other, each portion is still smaller in width than the magnetism sensitive part 8a shown in FIG. 16.

If the magnetic core layer in the magnetism sensitive part 8a is reduced in width as above, this will render a pulse output detected by the coil 3 steeper in shape, thereby enabling an azimuth to be detected with greater ease. The pulse output can be expressed by the following formula:

$$e = d\phi/dt = S(dB/dt)$$

where e: pulse output,
ϕ: magnetic flux,
B: magnetic flux density, and
S: cross sectional area of the magnetic core member in the magnetism sensitive part The smaller the width of the magnetic core layer in the magnetism sensitive part 8a, the cross sectional area S of the same becomes smaller, when the magnetic core layer 8 is uniform in thickness. Accordingly, if the magnetic core layer in the magnetism sensitive part 8a is reduced in width, the pulse output will become steeper in shape, however, the pulse output will become smaller in value. For this reason, the magnetism sensitive part 8a is provided with a plurality of the slender portions of the magnetic core layer, so that the total cross sectional area of the magnetic core layer within the magnetism sensitive part 8a in whole can be increased, thereby enabling a steep and large pulse output to be obtained.

The number of the slender portions of the magnetic core layer that constitute the magnetism sensitive part 8a may be four or more, however, if the respective slender portions of the magnetic core layer is excessively small in width, this will render it difficult to manufacture the same, and the respective slender portions will become prone to breakage. Accordingly, two or three of the slender portions would be appropriate. Further, the excitation coil 3a and the detection coil 3b of the coil 3 is wound around the plurality of the slender portions of the magnetic core layers altogether, or the coil 3 both using as the excitation coil and the detection coil is wound around the plurality of the same altogether.

Figure 18:
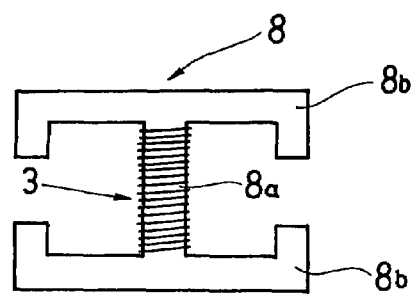

The magnetic core layer 8 shown in FIG. 18 is in the shape resembling the letter H, identical to that for the magnetic core layer 8 according to the embodiment shown in FIG. 1, but differs in shape from the latter in that both ends of two portions of magnetism collective part 8b joined with the respective ends of the magnetic core layer 8 are inwardly bent at right angles, respectively, in such a way as to mutually approach toward each other. With the adoption of such a shape as described, the external magnetic fluxes can be more efficiently collected.

The respective magnetic core layers 8, shown in FIGS. 19 to 23, have a makeup in common in that the magnetism collective part 8b are formed in a shape resembling a closed-loop surrounding the magnetism sensitive part 8a, and two portions of the magnetism collective part 8b joined together, opposed to each other with an enclosed space surrounded by the magnetism collective part 8b interposed therebetween, are connected to both ends of the magnetism sensitive part 8a, respectively, in such a way as to substantially halve the enclosed space by the magnetism sensitive part 8a.

Figure 19:
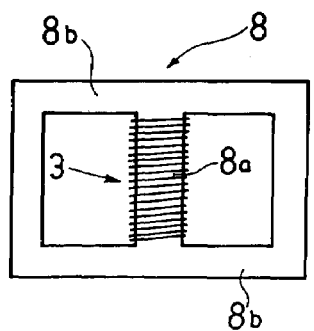

With the magnetic core layer 8 shown in FIG. 19, the magnetism collective part 8b are formed in the planar shape of a rectangular frame. Alternatively, the magnetism collective part 8b may be formed in the planar shape of a square frame instead of the rectangular frame.

Figure 20:
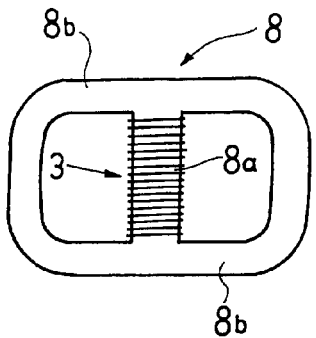

With the magnetic core layer 8 shown in FIG. 20, respective corners of the magnetism collective part 8b in the planar shape of a rectangular frame are formed in an arc-like shape. In the case of the magnetism collective part formed in the planar shape of a square frame, as well, respective corners thereof are preferably formed in an arc-like shape.

Figure 21:
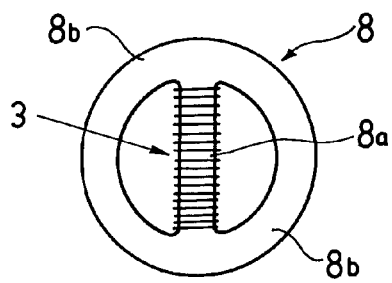

With the magnetic core layer 8 shown in FIG. 21, the magnetism collective part 8b are formed in the planar shape of a circular frame. With the magnetic core layer 8 shown in FIG. 22, the magnetism collective part 8b are formed in the planar shape of an oval frame. With the magnetic core layer 8 shown in FIG. 23, the magnetism collective part 8b are formed in the planar shape of an elliptical frame.

When the magnetism collective part 8b of the magnetic core layer 8 are formed in the shape like the closed loop, flexibility in layout of the electrode pads 15 to 18, serving as the respective terminals of the coil 3, is limited, however, it becomes possible to enable the external magnetic fluxes to more efficiently flow into the magnetism sensitive part 8a. More specifically, since the magnetism collective part 8b are joined with the magnetism sensitive part 8a in closed-loop manner, a demagnetizing field of the magnetism sensitive part 8a can be decreased, so that flow of magnetic fluxes becomes smoother, thereby enabling the external magnetic fluxes to efficiently flow into the magnetism sensitive part 8a.

Figure 22:
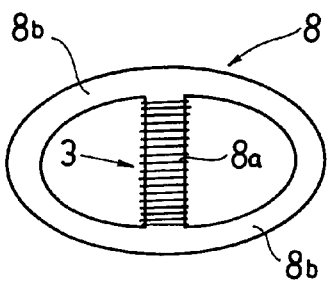
Figure 23:
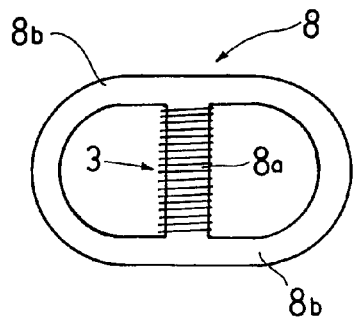

As with the examples of the respective magnetic core layers, shown in FIGS. 21 to 23, in particular, when the magnetism collective part 8b are rendered circular, oval, or elliptical in the planar shape, the flow of the magnetic fluxes becomes smoother.

Even in the case where the magnetism collective part 8b of the magnetic core layer 8 are formed in the planar shape of the rectangular frame or the square frame as an example shown in FIG. 20, the flow of the magnetic fluxes becomes smoother if respective corners thereof are rounded so as to be formed in an arc-like shape.

With the examples of the respective magnetic core layers 8, shown in FIGS. 18 to 23, as well, the portion of the magnetic core layer, serving as the magnetism sensitive part 8a, may be made up so as to have a plurality of slender portions separated from each other. In such cases, the coil 3 is also wound around the plurality of the slender portions magnetic core layer altogether. By so doing, detection sensitivity of the geomagnetism is enhanced.

Further, in FIGS. 1 and 3, the electrode pads 15 to 18 each are shown to be somewhat larger in size than those actually for the sake of clarity, however, the electrode pads 15 to 18 each can be formed smaller in size provided that sizes thereof will not interfere with mounting work to be executed later on. Respective positions where the electrode pads 15 to 18 are formed can be optionally altered. In the case of the example shown in FIG. 1, since the electrode pads 15 to 18 are formed between the two units of the magnetism collective part 8b, the whole size of the magnetic sensor element can be rendered smaller, however, the electrode pads may be provided outside of the magnetism collective part 8b as necessary.

What is claimed is:

1. A magnetic sensor element of a flux gate type comprising a magnetism sensitive part formed by winding a coil around a magnetic core layer, and magnetism collective part connected to respective ends of the magnetism sensitive part for guiding magnetic fluxes to the magnetism sensitive part;

wherein the magnetism collective part are a pair of magnetism collective part each in the shape of a long strip, formed integrally with the magnetic core layer of the magnetism sensitive part, extending in the direction orthogonal to the longitudinal direction of the magnetism sensitive part, respective central parts of the magnetism collective part, in the longitudinal direction thereof, are individually connected with the respective ends of the magnetism sensitive part; and wherein the coil is a thin-film coil comprising a plurality of upper coil thin-films provided on a surface of an upper insulation layer formed on one of principal surfaces of the magnetic core layer, opposite from the magnetic core layer, and a plurality of lower coil thin-films provided on a surface of a lower insulation layer formed on the other of the principal surfaces of the magnetic core layer, opposite from the magnetic core layer, formed by connecting together the respective lower coil thin-films and the adjacent upper coil thin-films, at respective ends thereof, so as to be sequentially continuous with each other.

2. A magnetic sensor element according to claim 1, wherein the magnetism sensitive part is formed by winding the coil around a plurality of divided magnetic core layers altogether.

3. A magnetic sensor element according to claim 1, wherein the magnetic core layer is uniform in thickness, and is formed in a whole shape such that a value of B/A falls in a range of 0.8 to 1.5 on the assumption that a length of the magnetic sensitive part, along the longitudinal direction, is A, and a length of the magnetism collective part along the direction orthogonal to the longitudinal direction of the magnetism sensitive part, is B.

4. A magnetic sensor element according to claim 3, wherein the magnetic core layer is formed such that a value of C/B falls in a range of 0.033 to 0.200 on the assumption that a length of the magnetism sensitive part along the direction orthogonal to the longitudinal direction thereof, is C.

5. A magnetic sensor element according to claim 1, wherein respective edges of the upper insulation layer in the transversely direction of the magnetism sensitive part, have a face inclined at a predetermined angle.

6. A magnetic sensor element according to claim 1, wherein the magnetic core layer is made up of a permalloy film mainly composed of iron and nickel, or a soft magnetic film mainly composed of iron, nickel, and cobalt, formed by sputtering or plating.

7. A magnetic sensor element according to claim 1, wherein the coil comprises two thin-film coils including an excitation coil and a detection coil, formed by connecting together the respective lower coil thin-films and the adjacent upper coil thin-films, at respective ends thereof, so as to be alternately and sequentially continuous with each other.

8. A magnetic sensor element of a flux gate type comprising a magnetism sensitive part formed by winding a coil around a magnetic core layer, and a magnetism collective part connected to respective ends of the magnetism sensitive part for guiding magnetic fluxes to the magnetism sensitive part;

wherein the magnetism collective part is formed in a shape resembling a closed-loop surrounding the magnetism sensitive part, formed integrally with the magnetic core layer of the magnetism sensitive part, and two portions of the magnetism collective part joined together, opposed to each other with an enclosed space surrounded by the magnetism collective part interposed therebetween, are connected to both ends of the magnetism sensitive part, in such a way as to substantially halve the enclosed space by the magnetism sensitive part; and wherein the coil is a thin-film coil comprising a plurality of upper coil thin-films provided on a surface of an upper insulation layer formed on one of principal surfaces of the magnetic core layer, opposite from the magnetic core layer, and a plurality of lower coil thin-films provided on a surface of a lower insulation layer formed on the other of the principal surfaces of the magnetic core layer, opposite from the magnetic core layer, formed by connecting together the respective lower coil thin-films and the adjacent upper coil thin-films, at respective ends thereof, so as to be sequentially continuous with each other.

9. A magnetic sensor element according to claim 8, wherein the magnetism collective part is formed in the planar shape of a square frame or a rectangular frame.

10. A magnetic sensor element according to claim 9, wherein respective corners of the square frame or the rectangular frame of the magnetism collective part are formed in an arc-like shape.

11. A magnetic sensor element according to claim 8, wherein the closed-loop magnetism collective part is formed in the planar shape of a circular frame, an elliptical frame, or an oval frame.

12. A magnetic sensor element according to claim 8, wherein the magnetism sensitive part is formed by winding the coil around a plurality of divided magnetic core layers altogether.

13. A magnetic sensor element according to claim 8, wherein respective edges of the upper insulation layer, in the transversely direction of the magnetism sensitive part, have a face inclined at a predetermined angle.

14. A magnetic sensor element according to claim 8, wherein the magnetic core layer is made up of a permalloy film mainly composed of iron and nickel, or a soft magnetic film mainly composed of iron, nickel, and cobalt, formed by sputtering or plating.

15. A magnetic sensor element according to claim 8, wherein the coil comprises two thin-film coils including an excitation coil and a detection coil, formed by connecting together the respective lower coil thin-films and the adjacent upper coil thin-films, at respective ends thereof, so as to be alternately and sequentially continuous with each other.

16. An electronic directional measuring device made up by arranging at least two units of the magnetic sensor elements on a nonmagnetic base, wherein the magnetic sensor elements each being a flux gate type comprising a magnetism sensitive part formed by winding a coil around a magnetic core layer, and magnetism collective part connected to respective ends of the magnetism sensitive part for guiding magnetic fluxes to the magnetism sensitive part;

wherein the magnetism collective part are a pair of magnetism collective part each in the shape of a long strip, formed integrally with the magnetic core layer of the magnetism sensitive part, extending in the direction orthogonal to the longitudinal direction of the magnetism sensitive part, respective central parts of the magnetism collective part, in the longitudinal direction thereof, are individually connected with the respective ends of the magnetism sensitive part; and wherein the coil is a thin-film coil comprising a plurality of upper coil thin-films provided on a surface of an upper insulation layer formed on one of principal surfaces of the magnetic core layer, opposite from the magnetic core layer, and a plurality of lower coil thin-films provided on a surface of a lower insulation layer formed on the other of the principal surfaces of the magnetic core layer, opposite from the magnetic core layer, formed by connecting together the respective lower coil thin-films and the adjacent upper coil thin-films, at respective ends thereof, so as to be sequentially continuous with each other.

17. An electronic directional measuring device according to claim 16, wherein a triaxial magnetic sensor is made up by arranging three units of the magnetic sensor elements on the nonmagnetic base, and by disposing the respective magnetic sensor elements such that the longitudinal directions of the respective magnetism sensitive parts thereof cross each other at right angles.

18. An electronic directional measuring device made up by arranging at least two units of the magnetic sensor elements on a nonmagnetic base,
- wherein the magnetic sensor elements each being a flux gate type comprising a magnetism sensitive part formed by winding a coil around a magnetic core layer, and a magnetism collective part connected to respective ends of the magnetism sensitive part for guiding magnetic fluxes to the magnetism sensitive part;
- wherein the magnetism collective part is formed each in a shape resembling a closed-loop surrounding the magnetism sensitive part, formed integrally with the magnetic core layer of the magnetism sensitive part, and two portions of the magnetism collective part joined together, opposed to each other with an enclosed space surrounded by the magnetism collective part interposed therebetween, are connected to both ends of the magnetism sensitive part, respectively, in such a way as to substantially halve the enclosed space by the magnetism sensitive part; and
- wherein the coil is a thin-film coil comprising a plurality of upper coil thin-films provided on a surface of an upper insulation layer formed on one of principal surfaces of the magnetic core layer, opposite from the magnetic core layer, and a plurality of lower coil thin-films provided on a surface of a lower insulation layer formed on the other of the principal surfaces of the magnetic core layer, opposite from the magnetic core layer, formed by connecting together the respective lower coil thin-films and the adjacent upper coil thin-films, at respective ends thereof, so as to be sequentially continuous with each other.

19. An electronic directional measuring device according to claim 18, wherein a triaxial magnetic sensor is made up by arranging three units of the magnetic sensor elements on the nonmagnetic base, and by disposing the respective magnetic sensor elements such that the longitudinal directions of the respective magnetism sensitive parts thereof cross each other at right angles.

\* \* \* \* \*